(12) United States Patent
Hong et al.

(10) Patent No.: US 12,144,163 B2
(45) Date of Patent: Nov. 12, 2024

(54) SELECTIVE DOUBLE DIFFUSION BREAK STRUCTURES FOR MULTI-STACK SEMICONDUCTOR DEVICE

(71) Applicant: SAMSUNG ELECTRONICS CO., LTD., Suwon-si (KR)

(72) Inventors: Byounghak Hong, Albany, NY (US); Seunghyun Song, Albany, NY (US); Saehan Park, Clifton Park, NY (US); Seungyoung Lee, Clifton Park, NY (US); Inchan Hwang, Schenectady, NY (US)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 225 days.

(21) Appl. No.: 17/382,060

(22) Filed: Jul. 21, 2021

(65) Prior Publication Data

US 2022/0336473 A1    Oct. 20, 2022

Related U.S. Application Data

(60) Provisional application No. 63/174,849, filed on Apr. 14, 2021.

(51) Int. Cl.
*H10B 10/00* (2023.01)
*H01L 21/762* (2006.01)
(Continued)

(52) U.S. Cl.
CPC ..... *H10B 10/125* (2023.02); *H01L 21/76224* (2013.01); *H01L 29/0665* (2013.01);
(Continued)

(58) Field of Classification Search
CPC ............ H10B 10/125; H01L 21/76224; H01L 29/0665; H01L 29/42392; H01L 29/66742;
(Continued)

(56) References Cited

U.S. PATENT DOCUMENTS 7,598,142 B2    10/2009 Ranade et al.
9,412,616 B1    8/2016 Xie et al.
(Continued)

FOREIGN PATENT DOCUMENTS

WO    2021/137945 A1    7/2021

OTHER PUBLICATIONS

K. Miyaguchi et al., "Single and Double Diffusion Breaks in 14nm FinFET and Beyond", Extended Abstracts of the 2017 International Conference on Solid State Devices and Materials, 2017, pp. 219-220, 2 pages total.
(Continued)

*Primary Examiner* — Jay C Kim
*Assistant Examiner* — Woo K Lee
(74) *Attorney, Agent, or Firm* — Sughrue Mion, PLLC

(57) ABSTRACT

A multi-stack semiconductor device includes: a plurality of lower transistor structures arranged on a lower stack and including a plurality of lower fin structures surrounded by a plurality of lower gate structures, respectively; a plurality of upper transistor structures arranged on an upper stack and including a plurality of upper fin structures surrounded by a plurality of upper gate structures, respectively; and at least one of a lower diffusion break structure on the lower stack
(Continued)

and a upper diffusion break structure on the upper stack, wherein the lower diffusion break structure is formed between two adjacent lower gate structures, and isolates two lower transistor structures respectively including the two adjacent lower gate structures from each other, and the upper diffusion break structure is formed between two adjacent upper gate structures, and isolates two upper transistor structures respectively including the two adjacent upper gate structures from each other.

19 Claims, 10 Drawing Sheets

(51) Int. Cl.
| | | |
|---|---|---|
| | *H01L 27/092* | (2006.01) |
| | *H01L 29/06* | (2006.01) |
| | *H01L 29/423* | (2006.01) |
| | *H01L 29/66* | (2006.01) |
| | *H01L 29/786* | (2006.01) |

(52) U.S. Cl.
CPC .. *H01L 29/42392* (2013.01); *H01L 29/66742* (2013.01); *H01L 29/78618* (2013.01); *H01L 27/092* (2013.01)

(58) Field of Classification Search
CPC ............. H01L 29/78618; H01L 27/092; H01L 21/8221
See application file for complete search history.

(56) References Cited

U.S. PATENT DOCUMENTS

| | | | |
|---|---|---|---|
| 10,505,546 | B2 | 12/2019 | Song et al. |
| 10,580,857 | B2 | 3/2020 | Wang et al. |
| 10,707,346 | B2 | 7/2020 | Hafez et al. |
| 10,892,322 | B2 | 1/2021 | Yang et al. |
| 10,950,506 | B2 | 3/2021 | Xie et al. |
| 2017/0141211 | A1* | 5/2017 | Xie ........................ H01L 29/785 |
| 2018/0083036 | A1* | 3/2018 | Agarwal ............. H01L 27/0207 |
| 2019/0057867 | A1 | 2/2019 | Smith et al. |
| 2019/0229021 | A1* | 7/2019 | Ando .................... H01L 29/775 |
| 2020/0312984 | A1* | 10/2020 | Lin .................. H01L 29/66628 |
| 2020/0343144 | A1* | 10/2020 | Li .................. H01L 21/823481 |
| 2020/0373196 | A1 | 11/2020 | Li et al. |

OTHER PUBLICATIONS

Communication dated Jul. 29, 2022 issued by the European Patent Office in counterpart European Application No. 22167076.3.

* cited by examiner

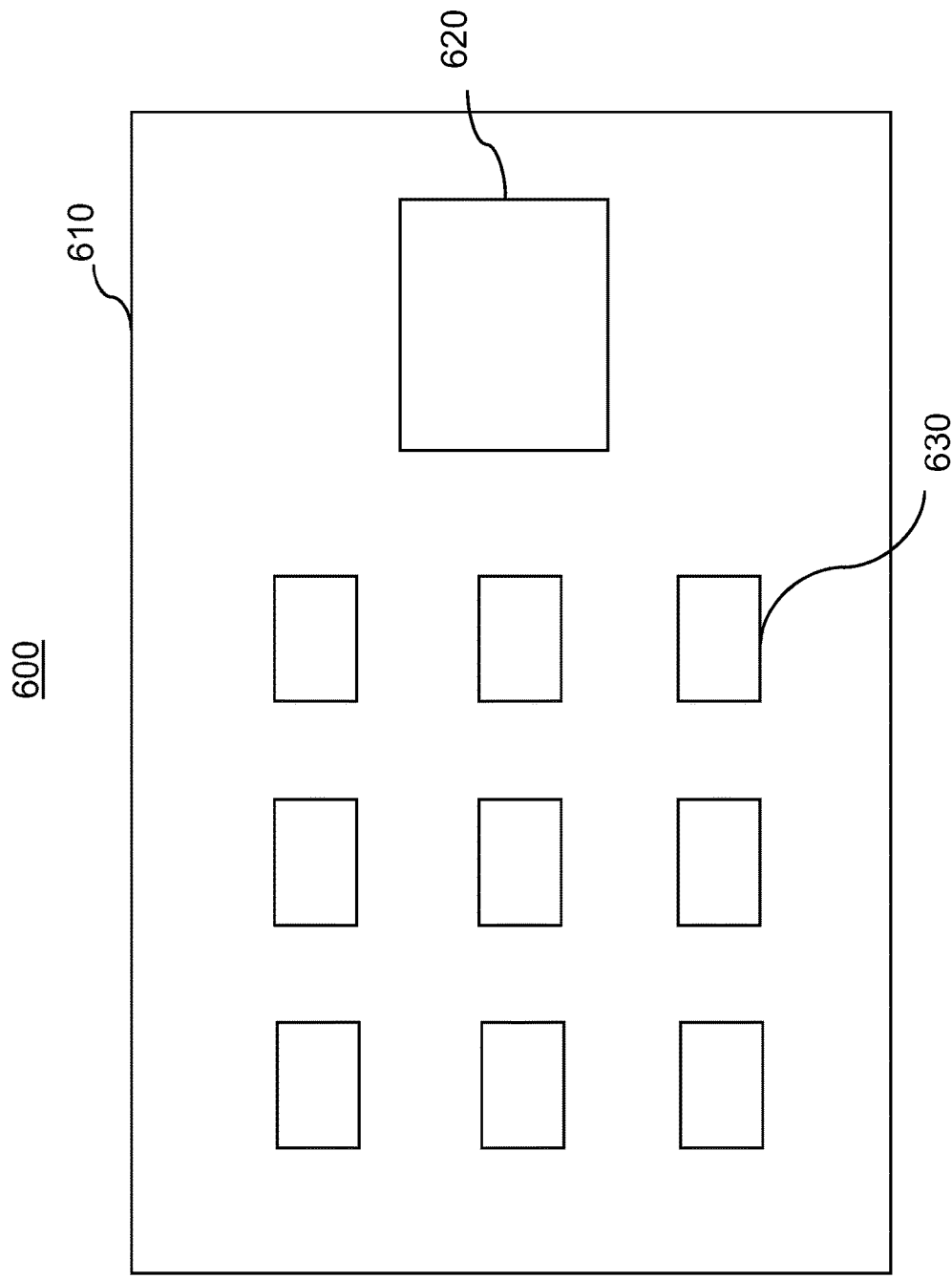

SELECTIVE DOUBLE DIFFUSION BREAK STRUCTURES FOR MULTI-STACK SEMICONDUCTOR DEVICE

CROSS-REFERENCE TO RELATED APPLICATION

This application is based on and claims priority from U.S. Provisional Application No. 63/174,849 filed on Apr. 14, 2021 in the U.S. Patent and Trademark Office, the disclosure of which is incorporated herein in its entirety by reference.

BACKGROUND

1. Field

Apparatuses and methods consistent with example embodiments of the inventive concept relate to a diffusion break structure of a semiconductor device, and particularly, to a stacked semiconductor device having different double diffusion break structures at upper and lower stacks.

2. Description of the Related Art

In modern semiconductor integrated circuits including microprocessors, memories and the like, a large number of transistors are formed in a limited area, and thus, device density has become a more important factor in designing a semiconductor device. However, device performance should not be sacrificed for achieving a high density semiconductor device.

Accordingly, while planar-structured transistors have evolved into gate all around semiconductor structures such as a fin field-effect transistor (finFET) and a nanosheet transistor (which is also termed as multi-bridge channel field-effect transistor (MBCFET)), isolation between adjacent transistors is also considered an important factor considered in semiconductor device design and manufacturing.

A diffusion break structure is generally employed to isolate or insulate (hereinafter referred to as "isolate") two horizontally adjacent transistors in an array of a plurality of transistors formed along a same fin structure providing active regions of a semiconductor device structure. These two adjacent transistors may be a same type of transistor such as a p-type field-effect transistor (PFET) or an n-type of field-effect transistor (NFET) forming a complementary metal oxide semiconductor (CMOS). In this case, the PFET and the NFET may be referred to as p-type metal-oxide semiconductor (PMOS) and n-type metal-oxide semiconductor (NMOS), respectively. The diffusion break structure is formed for not only the isolation purposes but also controlling stress applied to a channel region of the fin structure as well as source/drain regions formed from the fin structure of the array of transistors.

Two types of diffusion break structure are largely adopted in a semiconductor device design. They are a single diffusion break structure (SDB) that occupies an area of one gate structure formed across the fin structure in a D1 direction in the array of transistors, and a double diffusion break structure (DDB) that occupies an area of one gate pitch in the D1 direction in the array of transistors. Among the SDB and the DDB, however, the DDB is more frequently used in the semiconductor design and manufacturing due to its far better performance of isolation and stress control as well as easy formation, while the SDB structure may be employed in integrated circuits that require a higher device density sacrificing device performance. It is known that the DDB is usually used in a static random access memory (SRAM), and the SDB is more appropriate in logic circuits formed of a plurality transistors.

FIG. 1 illustrates a plan view of an array of transistor structures including a DDB structure.

Referring to FIG. 1, an array of transistor structures 10 includes a plurality of gate structures PC1-PC6 arranged in a row at a predetermined interval of a gate pitch GP along a fin structure F formed on a substrate 105. The fin structure F is provided to form a plurality of active regions RX extended in the D1 direction above the substrate 105. In the array of transistor structures 10, a plurality of transistor structures TR1-TR6 are formed of the gate structures PC1-PC6, respectively. Each of the transistor structures TR1-TR6 may be a finFET structure or a nanosheet structure. The active regions RX are formed along the fin structure F penetrating the gate structures PC1 and PC4 to function as channels for current flow in the transistor structures TR1 and TR4 when source/drain regions are formed at both sides of the gate structures PC1 and PC4 on the active regions RX.

The array of transistor structures 10 further includes a $1^{st}$ DDB structure 110 isolating the transistor structures TR2 and TR3 from each other, and a $2^{nd}$ DDB structure 120 isolating the transistor structures TR5 and TR6 from each other. As shown in FIG. 1, the two DDB structures 110 and 120 are respectively disposed at a space where an active region on the fin structure F between the gate structures PC2 and PC3 is removed and a space where an active region on the fin structure F between the gate structures PC5 and PC6 is removed. Each of the two DDB structures 110 and 120 may be formed by etching out a shallow trench isolation (STI) region at a corresponding position in the substrate or removing a corresponding portion of the fin structure F and filling an insulation material therein. Thus, each of the two DDB structures 110 and 120 occupies approximately a space of one gate pitch in the D1 direction, which is a channel length direction. Here, the transistor structures TR1-TR6 may be provided to form respective finFETs when completed.

The inventors have discovered that the DDB structure may be employed in an array of multi-stack transistor structures that may achieve a device density by forming transistors in a three-dimensional form. Moreover, the inventors have also discovered that the DDB structure may be selectively employed in the array of multi-stack transistor structures.

Information disclosed in this Background section has already been known to the inventors before achieving the disclosure of the present application or is technical information acquired in the process of achieving the disclosure. Therefore, it may contain information that does not form the prior art that is already known to the public

SUMMARY

The disclosure provides various multi-stack semiconductor devices including diffusion break structures selectively formed on a lower stack and/or an upper stack.

According to an embodiment, there is provided a multi-stack semiconductor device that may include: a plurality of lower transistor structures including a plurality of lower fin structures and a plurality of lower gate structures surrounding the lower fin structures, respectively, and arranged in a row on a lower stack; a plurality of upper transistor structures including a plurality of upper fin structures and a plurality of upper gate structures surrounding the upper fin structures, respectively, and arranged in a row on an upper stack to vertically correspond to the lower transistor structures, respectively; and at least one of a 1$^{st}$ lower diffusion break structure on the lower stack and a 1$^{st}$ upper diffusion break structure on the upper stack, wherein the 1$^{st}$ lower diffusion break structure is formed between 1$^{st}$ two adjacent lower gate structures, and isolates 1$^{st}$ two lower transistor structures respectively including the 1$^{st}$ two adjacent lower gate structures from each other, and wherein the 1$^{st}$ upper diffusion break structure is formed between 1$^{st}$ two adjacent upper gate structures, and isolates 1$^{st}$ two upper transistor structures respectively including the 1$^{st}$ two adjacent upper gate structures from each other.

According to an embodiment, there is provided a multi-stack semiconductor device that may include: a plurality of lower transistor structures including a plurality of lower fin structures and a plurality of lower gate structures surrounding the lower fin structures, respectively, and arranged in a row on a lower stack; and a plurality of upper transistor structures including a plurality of upper fin structures and a plurality of upper gate structures surrounding the upper fin structures, respectively, and arranged in a row on an upper stack to vertically correspond to the lower transistor structures, respectively, wherein at least one of a lower void space and an upper void space is formed at least one of the lower stack and the upper stack, respectively, wherein the lower void space is formed, as a lower diffusion break structure, between two adjacent lower gate structures, and isolates two lower transistor structures respectively including the two adjacent lower gate structures from each other on the lower stack, and wherein the upper void space is formed, as an upper diffusion break structure, between two adjacent upper gate structures, and isolates two upper transistor structures respectively including the two adjacent upper gate structures from each other on the upper stack.

According to an embodiment, there is provided a method of manufacturing a multi-stack semiconductor device. The method may include: forming a plurality of lower fin structures in a row on a lower stack and forming a plurality of upper fin structures in a row on an upper stack such that the upper fin structures vertically correspond to the lower fin structures, respectively; determining at least one of a pair of lower fin structures between which a lower diffusion break structure is to be formed, and a pair of upper fin structures between which an upper diffusion break structure is to be formed from among the lower fin structures and the upper fin structures; performing one of: growing source/drain regions from the lower fin structures and the upper fin structures except at least one position where at least one of the lower diffusion break structure and the upper diffusion break structure is to be formed; and growing source/drain regions from the lower fin structures and the upper fin structures, and removing at least one of the source/drain regions from at least one position where at least one of the lower diffusion break structure and the upper diffusion break structure is to be formed; forming a plurality of lower gate structures to surround the lower fin structures, respectively, and forming a plurality of upper gate structures to surround the upper fin structures, respectively; and forming at least one of the lower diffusion break structure and the upper diffusion break structure at the at least one position.

BRIEF DESCRIPTION OF DRAWINGS

Example embodiments will be more clearly understood from the following detailed description taken in conjunction with the accompanying drawings in which:

FIG. 6 illustrates a schematic plan view of a semiconductor module according to an embodiment.

DETAILED DESCRIPTION

Figure 1:
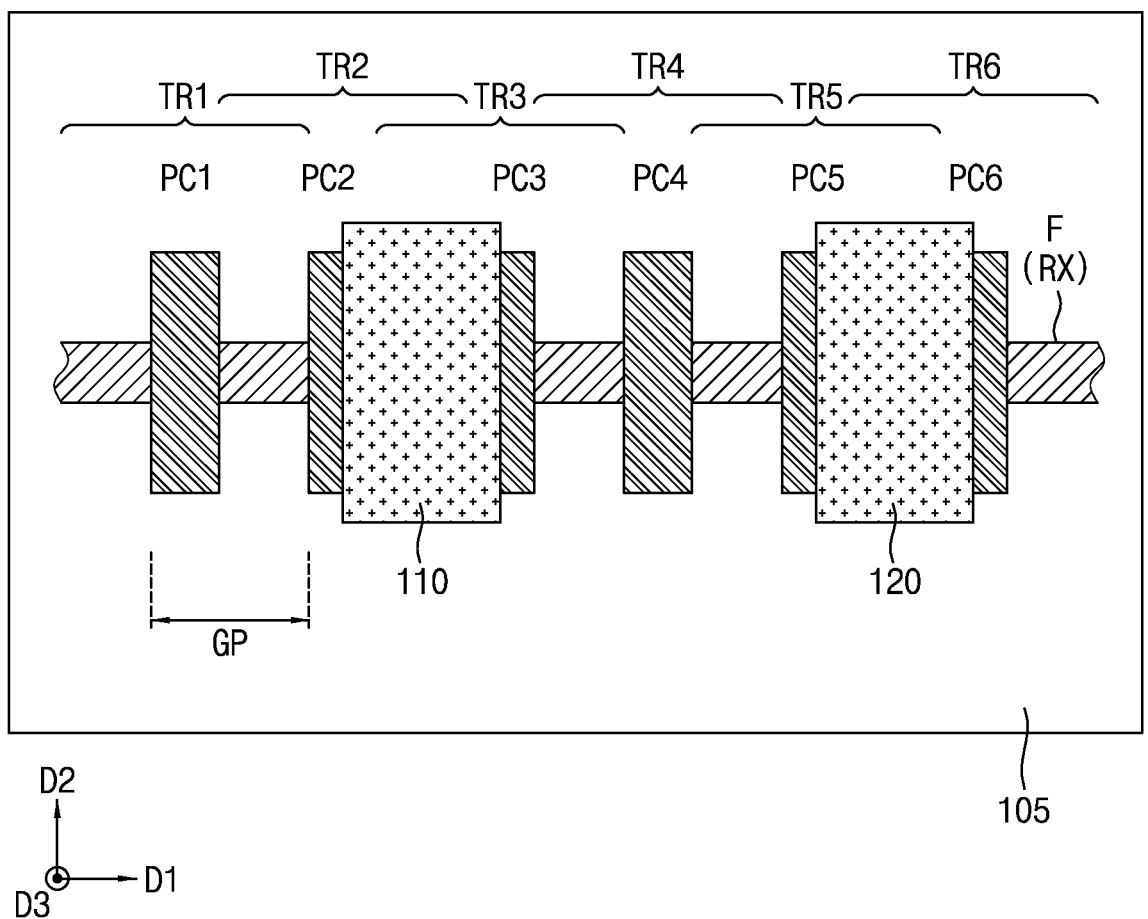
FIG. 1 illustrates a plan view of an array of transistor structures including a double diffusion break (DDB) structure.

The embodiments described herein are all example embodiments, and thus, the inventive concept is not limited thereto, and may be realized in various other forms. Each of the embodiments provided in the following description is not excluded from being associated with one or more features of another example or another embodiment also provided herein or not provided herein but consistent with the inventive concept. For example, even if matters described in a specific example or embodiment are not described in a different example or embodiment thereto, the matters may be understood as being related to or combined with the different example or embodiment, unless otherwise mentioned in descriptions thereof. In addition, it should be understood that all descriptions of principles, aspects, examples, and embodiments of the inventive concept are intended to encompass structural and functional equivalents thereof. In addition, these equivalents should be understood as including not only currently well-known equivalents but also equivalents to be developed in the future, that is, all devices invented to perform the same functions regardless of the structures thereof. For example, a MOSFET described herein may take a different type or form of a transistor as long as the inventive concept can be applied thereto.

It will be understood that when an element, component, layer, pattern, structure, region, or so on (hereinafter collectively "element") of a semiconductor device is referred to as being "over," "above," "on," "below," "under," "beneath," "connected to" or "coupled to" another element the semiconductor device, it can be directly over, above, on, below, under, beneath, connected or coupled to the other element or an intervening element(s) may be present. In contrast, when an element of a semiconductor device is referred to as being "directly over," "directly above," "directly on," "directly below," "directly under," "directly beneath," "directly connected to" or "directly coupled to" another element of the semiconductor device, there are no intervening elements present. Like numerals refer to like elements throughout this disclosure.

Spatially relative terms, such as "over," "above," "on," "upper," "below," "under," "beneath," "lower," and the like, may be used herein for ease of description to describe one element's relationship to another element(s) as illustrated in the figures. It will be understood that the spatially relative terms are intended to encompass different orientations of a semiconductor device in use or operation in addition to the orientation depicted in the figures. For example, if the semiconductor device in the figures is turned over, elements described as "below" or "beneath" other elements would then be oriented "above" the other elements. Thus, the term "below" can encompass both an orientation of above and below. The semiconductor device may be otherwise oriented (rotated 90 degrees or at other orientations) and the spatially relative descriptors used herein interpreted accordingly. In addition, terms such as a "row" and a "column" of an array, in which a plurality of semiconductor structures are arranged, may be interpreted as a "column" and a "row" when the array is rotated 90 degrees.

As used herein, expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c. Herein, when a term "same" is used to compare a dimension of two or more elements, the term may cover a "substantially same" dimension.

It will be understood that, although the terms $1^{st}$, $2^{nd}$, $3^{rd}$, $4^{th}$, etc. may be used herein to describe various elements, these elements should not be limited by these terms. These terms are only used to distinguish one element from another element. Thus, a $1^{st}$ element discussed below could be termed a $2^{nd}$ element without departing from the teachings of the inventive concept.

It will be also understood that, although in an embodiment of manufacturing an inventive apparatus or structure, a step or operation is described later than another step or operation, the step or operation may be performed later than the other step or operation unless the other step or operation is described as being performed after the step or operation.

Many embodiments are described herein with reference to cross-sectional illustrations that are schematic illustrations of the embodiments (and intermediate structures). As such, variations from the shapes of the illustrations as a result, for example, of manufacturing techniques and/or tolerances, are to be expected. Thus, the embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept. Further, in the drawings, the sizes and relative sizes of layers and regions may be exaggerated for clarity.

For the sake of brevity, conventional elements to a semiconductor device including a nanosheet transistor structure may or may not be described in detail herein when those elements are not related to the inventive concept. Further, even if those conventional elements are described, their specific structures or materials forming thereof may not be described herein when those structures or materials are not related to the inventive concept.

It is noted that the term "transistor structure" used in the present disclosure may refer to a transistor structure with source/drain regions or a transistor structure in which one of the source/drain regions is removed for description purposes. For example, when two transistor structures are described as being isolated from each other by a diffusion break structure, at least one of the two transistor structures may refer to a transistor structure including source/drain regions or a transistor structure in which one of the source/drain regions is removed.

Figure 2A:
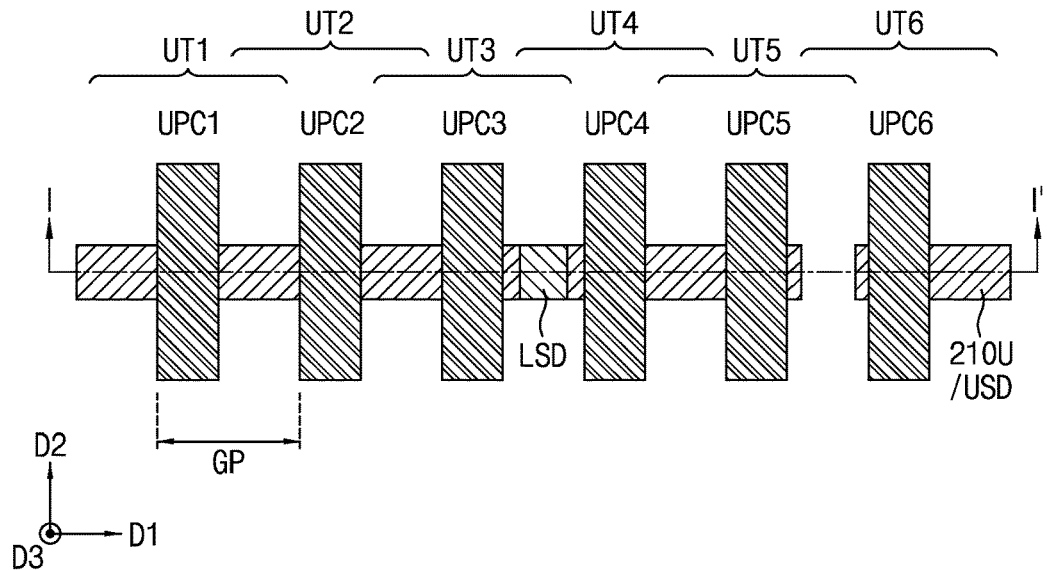
FIGS. 2A and 2B illustrates a multi-stack semiconductor device including a plurality of multi-stack nanosheet structures and diffusion break structures formed on a lower stack and an upper stack, according to an embodiment.
Figure 2B:
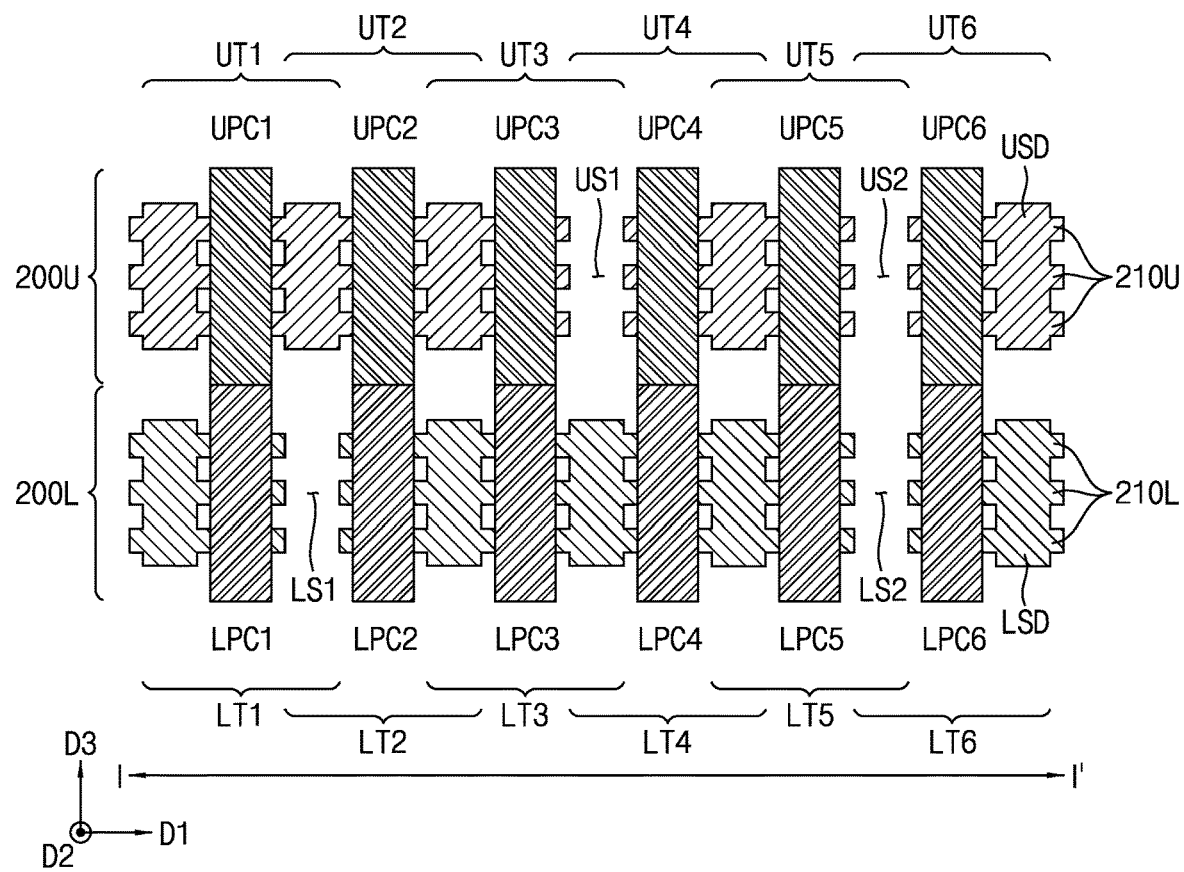
Figure 2C:
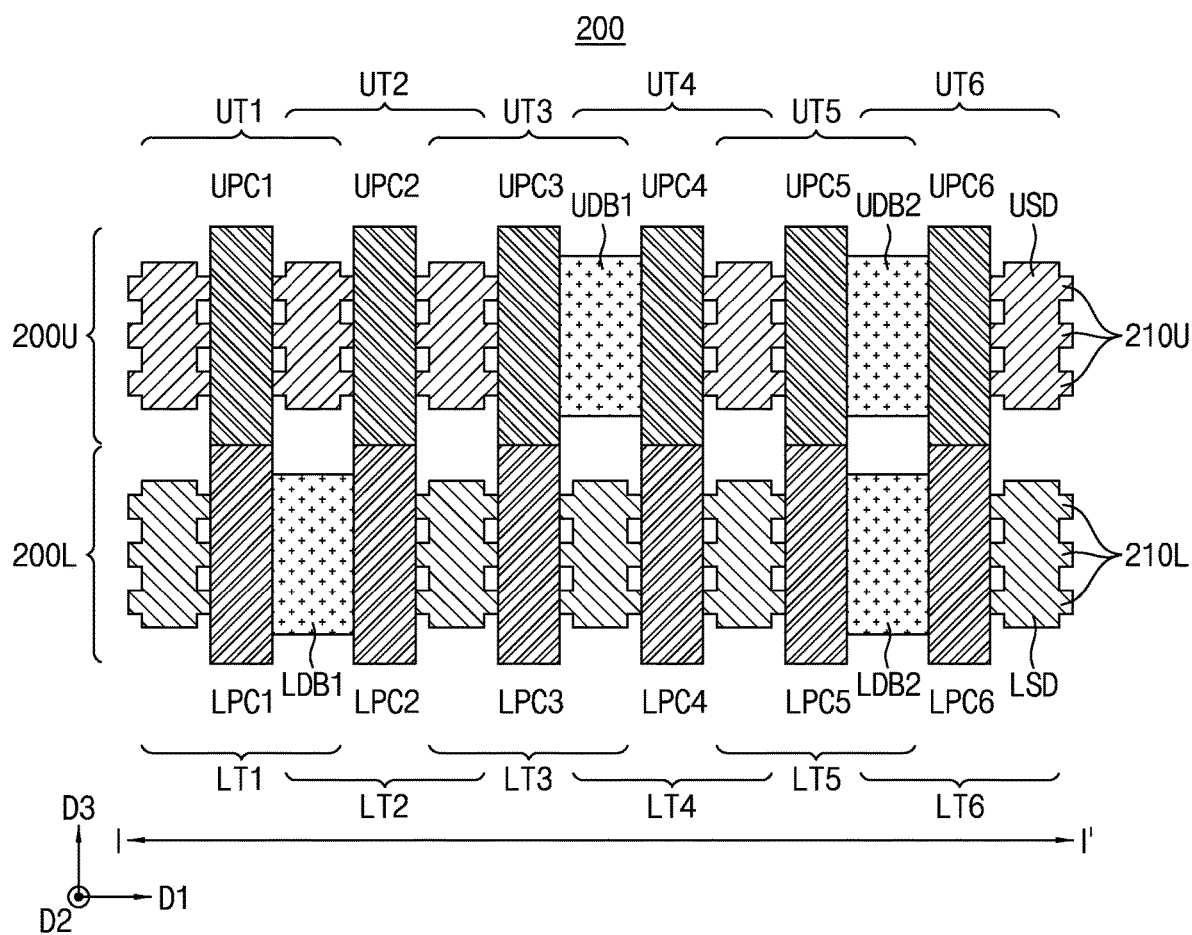
FIG. 2C illustrates the multi-stack semiconductor device shown in FIGS. 2A and 2B in which diffusion break structures are filled with an insulation material, according to an embodiment.

FIGS. 2A and 2B illustrates a multi-stack semiconductor device including a plurality of multi-stack nanosheet structures and diffusion break structures formed on a lower stack and an upper stack, according to an embodiment, and FIG. 2C illustrates the multi-stack semiconductor device shown in FIGS. 2A and 2B in which diffusion break structures are filled with an insulation material, according to an embodiment.

Referring to FIGS. 2A and 2B, a multi-stack semiconductor device 200 includes a plurality of lower nanosheet structures LT1-LT6 formed in a row on a lower stack 200L, and a plurality of upper nanosheet structures UT1-UT6, vertically corresponding to the lower nanosheet structures LT1-LT6, respectively, are formed in a row on an upper stack 200U. FIGS. 2A and 2B show that the lower nanosheet structures LT1-LT6 and the upper nanosheet structures UT1-UT6 are both arranged in a D1 direction, which is a channel length direction, at a predetermined interval of a gate pitch GP. It is understood herein that one structure vertically corresponding to another structure may refer to that one structure is formed or disposed vertically above or below the other structure in a D3 direction, which is a channel height direction, perpendicular to the D1 direction.

Each of the lower nanosheet structures LT1-LT6 includes a plurality of lower nanosheet layers 210L as its fin structure, which is used as a current channel of a lower nanosheet transistor when each lower nanosheet structure is completed as a lower nanosheet transistor. The lower nanosheet layers 210L may be formed by epitaxially growing one layer and then another until a desired number of nanosheet layers are alternatingly stacked with sacrificial layers (not shown) therebetween on a substrate (not shown). The lower nanosheet layers 210L of each lower nanosheet structure are surrounded by a corresponding lower gate structure, and thus, a plurality of lower gate structures LPC1-LPC6 are formed to surround the lower nanosheet layers 210L of the lower nanosheet structures LT1-LT6, respectively.

In addition, each of the lower nanosheet structures LT1-LT6 includes lower source/drain regions LSD formed on a left side and a right side of a corresponding lower gate structure among the lower gate structures LPC1-LPC6, except that no source/drain region is formed at a lower space or trench (hereafter collectively "space") LS1 between the lower gate structures LPC1 and LPC2 and a lower space LS2 between the lower gate structures LPC5 and LPC6. The lower space LS1 is provided to form a lower diffusion break structure therein to isolate the lower nanosheet structures LT1 and LT2 from each other, and the lower space LS2 is provided to form another lower diffusion break structure therein to isolate the lower nanosheet structures LT5 and LT3 from each other.

The lower source/drain regions LSD may be epitaxially grown from at least the lower nanosheet layers 210L to a left side and/or a right side of each lower gate structure surrounding the lower nanosheet layers 210L. Each of the lower source/drain regions LSD between two adjacent lower nanosheet structures, specifically between their lower gate structures, on the lower stack 200L may be formed to be shared by the two adjacent lower nanosheet structures. Each of these lower source/drain regions LSD may be referred to as a merged lower source/drain region. For example, the lower nanosheet structures LT2 and LT3 share a lower source/drain region LSD formed between the lower gate structures LPC2 and LPC3, and the lower nanosheet structures LT3 and LT4 share a lower source/drain region LSD formed between the lower gate structures LPC3 and LPC4.

Although not shown in FIGS. 2A-2C, a lower source/drain contact structure may be formed on at least one of the lower source/drain regions LSD to provide at least one of a positive voltage and a ground voltage, or to be connected to another circuit element of the multi-stack semiconductor device.

According to an embodiment, the lower space LS1 may be provided by not epitaxially growing a lower source/drain region between the lower gate structures LPC1 and LPC2. In other words, the lower nanosheet structure LT1 may be formed not to have a lower source/drain region on a right side of its lower gate structure LPC1, and the lower nanosheet structure LT2 may be formed not to have a lower source/drain region on a left side of its lower gate structure LPC2. Likewise, the lower space LS2 may be provided by not epitaxially growing a lower source/drain region between the lower gate structures LPC5 and LPC6, according to an embodiment. In other words, the lower nanosheet structure LT5 may be formed not to have a lower source/drain region on a right side of its lower gate structure LPC5, and the lower nanosheet structure LT6 may be formed not to have a lower source/drain region on a left side of its lower gate structure LPC6. Thus, among the lower nanosheet structures LT1-LT6, the lower nanosheet structures LT1, LT2, LT5 and LT6 may not be completed to form a nanosheet transistor because one source/drain region is not formed on a left side or a right side of a corresponding lower gate structure. That is, the lower nanosheet structures LT1, LT2, LT5 and LT6 may be left in an uncompleted form on the lower stack 200L of the multi-stack semiconductor device 200.

According to another embodiment, the lower spaces LS1 and LS2 may be provided by epitaxially growing respective lower source/drain regions between the lower gate structures LPC1 and LPC2 and between the lower gate structures LPC5 and LPC6 like the other source/drain regions on the lower stack 200L, and then, removing these lower source/drain regions. Thus, the lower nanosheet structures LT1, LT2, LT5 and LT6 may be left disabled on the lower stack 200L of the multi-stack semiconductor device 200.

Similar to the lower nanosheet structures LT1-LT6, each of the upper nanosheet structures UT1-UT6 includes a plurality of upper nanosheet layers 210U as its fin structure, which is used as a current channel of an upper nanosheet transistor when each upper nanosheet structure is completed as an upper nanosheet transistor. The upper nanosheet layers 210U may be formed by epitaxially growing one layer and then another until a desired number of nanosheet layers are alternatingly stacked with sacrificial layers (not shown) therebetween on the substrate. The upper nanosheet layers 210U of each upper nanosheet structure are surrounded by a corresponding upper gate structure, and thus, a plurality of upper gate structure UPC1-UPC6 are formed to surround the upper nanosheet layers 210U of the lower nanosheet structures LT1-LT6, respectively.

In addition, each of the upper nanosheet structures UT1-UT6 includes upper source/drain regions USD formed on a left side and a right side of a corresponding upper gate structure among the upper gate structures UPC1-UPC6, except that no source/drain region is formed at an upper space US1 between the upper gate structures UPC3 and UPC4 and an upper space US2 between the upper gate structures UPC5 and UPC6. The upper space US1 is also provided to form an upper diffusion break structure therein to isolate the upper nanosheet structures UT3 and UT4 from each other, and the upper space US2 is provided to form another upper diffusion break structure therein to isolate the upper nanosheet structures UT5 and UT6 from each other.

According to an embodiment, the upper space US2 is formed to be vertically corresponding to the lower space LS2 as shown in FIG. 2B.

The upper source/drain regions USD may also be epitaxially grown from at least the upper nanosheet layers 210U to a left side and/or a right side of each upper gate structure surrounding the upper nanosheet layers 210U. Each of the upper source/drain regions USD between two adjacent upper nanosheet structures, specifically between their upper gate structures, on the upper stack 200U may be formed to be shared by the two adjacent upper nanosheet structures. Each of these upper source/drain regions USD may also be referred to as a merged upper source/drain region. For example, the upper nanosheet structures UT1 and UT2 share an upper source/drain region USD formed between the upper gate structures UPC1 and UPC2, and the lower nanosheet structures UT4 and UT5 share an upper source/drain region USD formed between the lower gate structures UPC4 and UPC5.

Although not shown in FIGS. 2A-2C, an upper source/drain contact structure may be formed on at least one of the upper source/drain regions USD to provide at least one of a positive voltage and a ground voltage, or to be connected to another circuit element of the multi-stack semiconductor device 200.

According to an embodiment, the upper space US1 may also be provided by not epitaxially growing an upper source/drain region between the upper gate structures UPC3 and UPC3. In other words, the upper nanosheet structure UT3 may be formed not to have an upper source/drain region on a right side of its upper gate structure UPC3, and the upper nanosheet structure UT4 may be formed not to have an upper source/drain region on a left side of its upper gate structure UPC4. Likewise, the upper space US2 may be provided by not epitaxially growing an upper source/drain region between the upper gate structures UPC5 and UPC6, according to an embodiment. In other words, the upper nanosheet structure UT5 may be formed not to have an upper source/drain region on a right side of its lower gate structure UPC5, and the upper nanosheet structure UT6 may be formed not to have an upper source/drain region on a left side of its upper gate structure UPC6 Thus, among the upper nanosheet structures UT1-UT6, the upper nanosheet structures UT3, UT4, UT5 and UT6 may not be completed to form a nanosheet transistor because one source/drain region is not formed on a left side or right side of a corresponding upper gate structure. That is, the upper nanosheet structures UT3, UT4, UT5 and UT6 may be left in an uncompleted form on the lower stack 200L of the multi-stack semiconductor device 200.

According to another embodiment, the upper spaces US1 and US2 may be provided by epitaxially growing respective upper source/drain regions between the upper gate structures LPC3 and UPC4 and between the upper gate structures UPC5 and UPC6 like the other upper source/drain regions on the upper stack 200U, and then, removing these upper source/drain regions. Thus, the upper nanosheet structures UT3, UT4, UT5 and UT6 may be left disabled on the upper stack 200U of the multi-stack semiconductor device 200.

According to an embodiment, the lower spaces LS1 and LS2 formed on the lower stack 200L and the upper spaces US1 and US2 formed on the upper stack 200U may be filled with an insulation material to provide respective diffusion break structures of the multi-stack semiconductor device 200, as shown in FIG. 2C. The insulation material to form these diffusion break structures may include at least one of silicon nitride (SiN), a combination of SiN and an oxide material including silicon oxide (SiO) or silicon dioxide (SiO$_2$), tonen silazene (TOSZ), not being limited thereto, according to an embodiment. When the lower nanosheet structures LT1-LT6 are p-type nanosheet transistor structures, lower diffusion break structures LDB1 and LDB2 respectively formed in the lower spaces LS1 and LS2 may include a material such as SiN, SiO and/or SiO$_2$, not being limited thereto, favorable to compressive stress control of a p-type transistor. In contrast, when the upper nanosheet transistor structures UT1-UT6 are n-type nanosheet structures, upper diffusion break structures UDB1 and UDB2 respectively formed in the upper spaces US1 and US2 may include a material such as TOSZ, not being limited thereto, favorable to tensile stress control of an n-type transistor.

Each of the diffusion break structures formed above on the lower stack 200L and the upper stack 200U of the multi-stack semiconductor device 200 leaves two nanosheet structures on its left side and right side uncompleted or disabled, and thus, these diffusion break structures may also be referred to as double diffusion break (DDB) structures.

Each of the lower nanosheet layers 210L and the upper nanosheet layers 210U may be formed of a material including silicon (Si), silicon germanium (SiGe), and/or carbon doped silicon (SiC), not being limited thereto, and doped by adding p-type dopants (e.g., boron or gallium) or n-type dopants (e.g., phosphorus or arsenic) depending on a type of transistor to be formed. Each of the lower gate structures LPC1-LPC6 and the upper gate structures UPC1-UPC6 may include a hafnium (Hf) based high-k dielectric layer and a conductor metal such as tungsten (W) or aluminum (Al) along with a work function metal layer formed of Titanium (Ti), Tantalum (Ta) or their compound. When each of the lower nanosheet structures LT1-LT6 is formed to become a p-type transistor, that is, PFET or PMOS, and each of the upper nanosheet structures UT1-UT6 is formed to become an n-type transistor, that is, NFET or NMOS, the lower gate structures LPC1-LPC6 may have a different material composition from the upper gate structures UPC1-UPC6. However, when one of the lower nanosheet structures LT1-LT6 and a vertically corresponding upper nanosheet structure among the upper nanosheet structures UT1-UT6 is designed to share a gate to be commonly connected to one of a positive voltage source and a ground source, or another circuit element, a corresponding lower gate structure and a vertically corresponding upper gate structure may be connected to each other or shared by the two nanosheet structures, and formed of the same material composition.

The above embodiments provide formation of a diffusion break structure by not forming a source/drain region between two adjacent nanosheet structures. However, the disclosure is not limited thereto. According to an embodiment, at least the upper stack 200U of the multi-stack semiconductor device 200 may be structured differently from the previous embodiments.

Figure 3A:
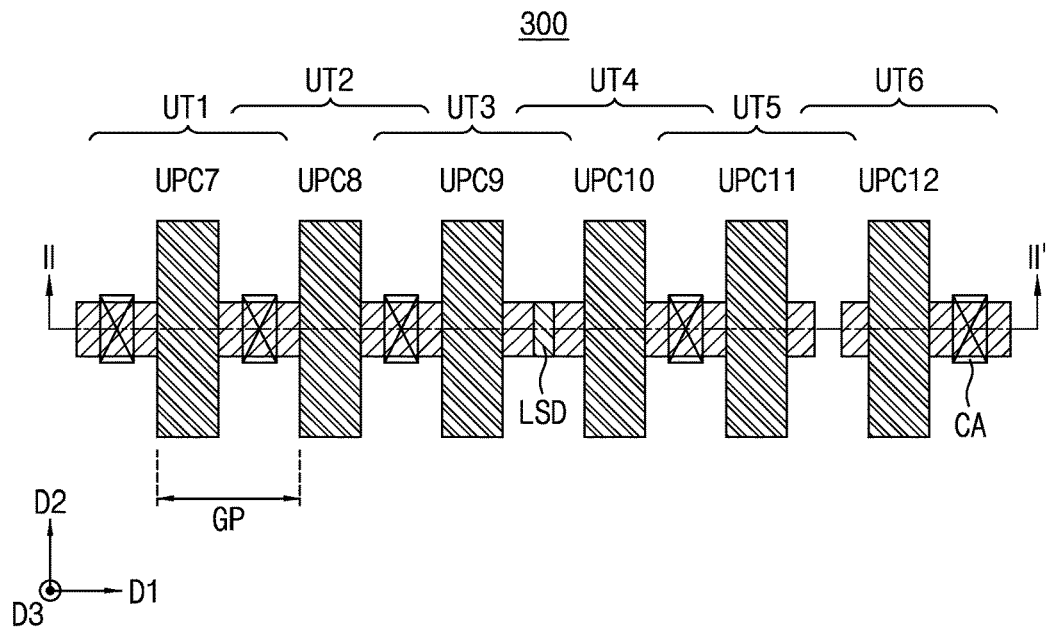
FIGS. 3A and 3B illustrates a multi-stack semiconductor device including a plurality of multi-stack nanosheet structures and diffusion break structures formed on a lower stack and an upper stack, according to an embodiment.
Figure 3B:
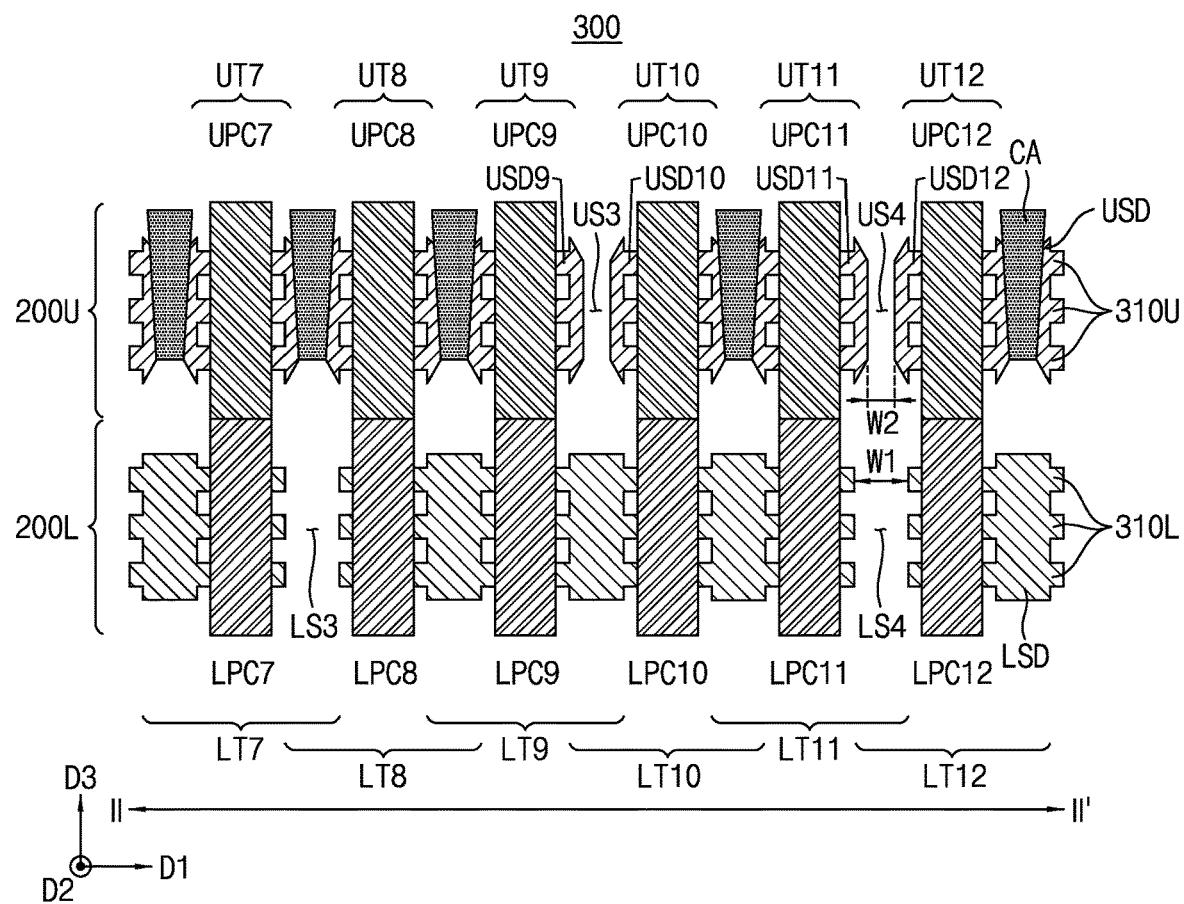
Figure 3C:
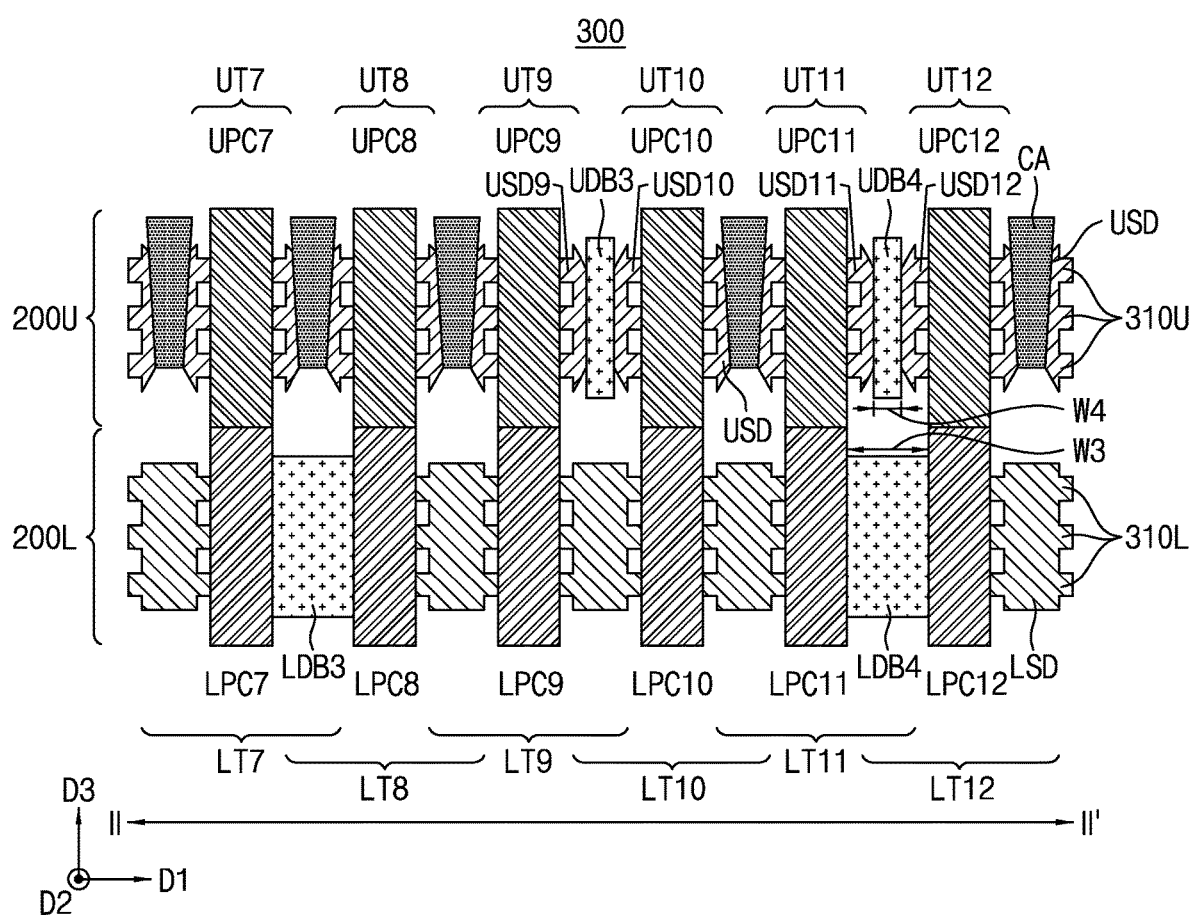
FIG. 3C illustrates the multi-stack semiconductor device shown in FIGS. 3A and 3B in which diffusion break structures are formed, according to an embodiment.

FIGS. 3A and 3B illustrates a multi-stack semiconductor device including a plurality of multi-stack nanosheet structures and diffusion break structures formed on a lower stack and an upper stack, according to an embodiment, and FIG. 3C illustrates the multi-stack semiconductor device shown in FIGS. 3A and 3B in which diffusion break structures are formed, according to an embodiment.

Referring to FIGS. 3A and 3B, a multi-stack semiconductor device 300 includes a plurality of lower nanosheet structures LT7-LT12 formed in a row at a lower stack 300L, and a plurality of upper nanosheet structures UT7-UT12, vertically corresponding to the lower nanosheet structures LT7-LT12, respectively, are formed in a row at an upper stack 300U.

The lower nanosheet structures LT7-LT12 shown in FIGS. 3A and 3B are the same as the lower nanosheet structures LT1-LT6 shown in FIGS. 2A and 2B. Thus, it is understood that a plurality of lower nanosheet layers 310L, a plurality of lower gate structures LPC7-LPC12, lower source/drain regions LSD, and lower spaces LS3 and LS4 shown in FIGS. 3A and 3B correspond to the lower nanosheet layers 210L, the lower gate structures LPC1-LPC6, the lower source/drain regions LSD, and the lower spaces LS1 and LS2 shown in FIGS. 2A and 2B, respectively. Further, it is understood that lower diffusion break structures LDB3 and LDB4 shown in FIGS. 3A and 3C correspond to the lower diffusion break structures LDB1 and LDB2 shown in FIGS. 2A and 2C, respectively. Thus, duplicate descriptions about the structures formed on the lower stack 300L of the multi-stack semiconductor device 300 are omitted herein.

Further, although not shown in FIGS. 3A-3C, a lower source/drain contact structure may be formed on each of the lower source/drain regions LSD to provide at least one of a positive voltage and a ground voltage, or to be connected to another circuit element of the multi-stack semiconductor device 300.

The upper stack 300U of the present embodiment also includes some elements which are the same as those included in the upper stack 200U of the previous embodiment shown in FIGS. 2A-2C. For example, the upper nanosheet structures UT7-UT12 shown in FIGS. 3A-3C have upper nanosheet layers 310U and a plurality of upper gate structures UPC7-UPC12 respectively corresponding to the upper nanosheet layers 210U and the upper gate structures UPC1-UPC6 shown in FIGS. 2A-2C.

However, the upper stack 300U of the present embodiment differs from the upper stack 200U of the previous embodiment in its upper source/drain regions USD of the upper nanosheet structures UT7-UT12, upper spaces US3 and US4, and upper diffusion break structures UDB3 and UDB4 respectively formed in the upper spaces US3 and US4. The upper space US4 may be formed to be vertically corresponding to the lower space LS4.

In the previous embodiment, the upper source/drain regions USD formed on the upper stack 200U are all merged source/drain regions shared by two adjacent upper nanosheet structures. In addition, the lower source/drain regions LSD on the lower stack 300L according to the present embodiment are also all merged source/drain regions shared by two adjacent lower nanosheet structures. Moreover, in the previous embodiment, the upper source/drain regions USD are not formed at positions where the upper spaces US1 and US2 are provided to form the corresponding upper diffusion break structures. However, the upper source/drain regions USD in the upper stack 300U in the present embodiment are formed not to be shared by two adjacent upper nanosheet structures, and further, all of the upper nanosheet structures UT7-UT12 have the upper source/drain regions USD even at positions where the upper spaces US3 and US4 are provided.

For example, an upper source/drain region USD9 of the upper nanosheet structure UT9 is formed at a right side of the upper gate structure UPC9 without being shared by the upper nanosheet structures UT10, and an upper source/drain region USD10 of the upper nanosheet structures UT10 is formed at a left side of the upper gate structure UPC10 without being shared by the upper nanosheet structure UT9. In addition, an upper source/drain region USD11 of the upper nanosheet structure UT11 is formed at a right side of the upper gate structure UPC11 without being shared by the upper nanosheet structures UT12, and an upper source/drain region USD12 of the upper nanosheet structures UT12 is formed at a left side of the upper gate structure UPC12 without being shared by the upper nanosheet structure UT11.

However, the upper space US3 is provided to form an upper diffusion break structure to isolate the upper source/drain regions USD9 and USD10 from each other, and the upper space US4 is provided to form another upper diffusion break structure to isolate the upper source/drain regions USD11 and USD12 from each other.

In contrast, each of the upper source/drain regions USD, other than the upper source/drain regions USD9-USD12, is connected to an adjacent upper source/drain region of an adjacent upper nanosheet structure though an upper source/drain contact structure CA as shown in FIGS. 3A-3C. It is noted here that, as the upper source/drain contact structure CA is not formed on each of the upper source/drain regions USD9-USD12, these source/drain regions may be disabled, according to an embodiment. Thus, an upper diffusion break structure may be formed by not forming the upper source/drain contact structure on the upper source/drain regions USD9-US12.

It is further noted that a width W2 of each of the upper spaces US3 and US4 formed in the upper stack 300U may be smaller than a width W1 of each of the lower spaces LS3 and LS4 formed in the lower stack 300L. This is because the upper source/drain regions USD9 and USD10 are formed on a left side and a right side of the upper space US3, and the upper source/drain regions USD11 and USD12 are formed on a left side and a right side of the upper space US4, on the upper stack 300U.

Similar to the previous embodiment, the lower spaces LS3 and LS4 formed on the lower stack 300L and the upper spaces US3 and US4 formed on the upper stack 300U may also be filled with an insulation material that forms lower diffusion break structures LDB3 and LDB4 and upper diffusion break structures UDB3 and UDB4, respectively. The insulation material forming these diffusion break structures may be the same as that described in the previous embodiment, and thus, duplicate descriptions thereof are omitted herebelow. As each of the upper spaces US3 and US4 has a smaller width than each of the lower spaces LS3 and LS4, a width W4 of each of the upper diffusion break structures UDB3 and UDB4 may be smaller than a width W3 of each of the lower diffusion break structures LDB3 and LDB4. However, each of the upper diffusion break structures UDB3 and UDB4 may also leave two upper nanosheet structures on its left side and right side uncompleted or disabled, and thus, they may also be referred to as double diffusion break (DDB) structures.

The above embodiments describe, in reference to FIGS. 2A-2C and 3A-3C, that the multi-stack semiconductor devices 200 and 300 are formed of six nanosheet structures arranged in a row with two diffusion break structures on each of the lower stack and the upper stack, each nanosheet structure is formed of three nanosheet layers, and the nanosheet structures formed on the upper stack and the nanosheet structures formed on the lower stack have different types between p-type and n-type. However, the disclosure is not limited thereto. For example, the multi-stack semiconductor devices 200 and 300 may include more or less than six nanosheet structures arranged in more than one row with more or less than two diffusion break structures on each or either of more than two stacks, and each nanosheet structure may include more or less than three nanosheet layers. According to embodiments, the nanosheet structures on the lower stack or the upper stack may be either of p-type and n-type, or only one of p-type and n-type. Moreover, all or part of the nanosheet structures formed on at least one of the lower stack and the upper stack of the multi-stack semiconductor devices 200 and 300 may be replaced with a different gate-all-around transistor structure such as finFET structure having one or more fin structures as its current channel, according to embodiments.

Further, the above embodiments describe, in reference to FIGS. 2A-2C and 3A-3C, that each of the lower gate structures LPC1-LPC6 is connected to a corresponding one of the upper gate structures UPC1-UPC6 in a continuous structure form. However, the disclosure is not limited thereto. According to an embodiment, one or more of the lower gate structures LPC1-LPC6 may not be respectively connected to one or more of vertically corresponding ones of the upper gate structures UPC1-UPC6, and instead, one or more isolation layers may be formed therebetween, subject to a design of a multi-stack semiconductor device. According to another embodiment, even when one of the lower gate structures LPC1-LPC6 should be connected to a vertically corresponding one of the upper gate structures UPC1-UPC6, there may be formed an isolation layer therebetween, and instead, the vertically corresponding lower gate structure and upper gate structure may be connected to each other in a different structural form, subject to a design of a multi-stack semiconductor device.

It is understood that FIGS. 2A-2C and 3A-3C do not show all elements constituting the multi-stack semiconductor devices 200 and 300, respectively. For example, various isolation layers including the isolation layer between the vertically corresponding lower and upper gate structures are omitted for brevity convenience.

It is also understood that, although FIGS. 2A-2C and 3A-3C show only one row of the lower nanosheet structures LT1-LT6 and the upper nanosheet structures UT1-UT6, the multi-stack semiconductor devices 200 and 300 may include one or more additional rows of lower nanosheet structures and upper nanosheet structures formed on the same substrate, according to embodiments. Thus, the lower gate structures LPC1-LPC6 and the upper gate structures UPC1-UPC6 may be extended in a D2 direction on the substrate, according to an embodiment.

As discussed earlier in the Background section, the double diffusion break (DDB) structure such as the diffusion break structures shown in FIGS. 2A-2C and 3A-3C may be generally employed in a memory device such as SRAM.

Figure 4A:
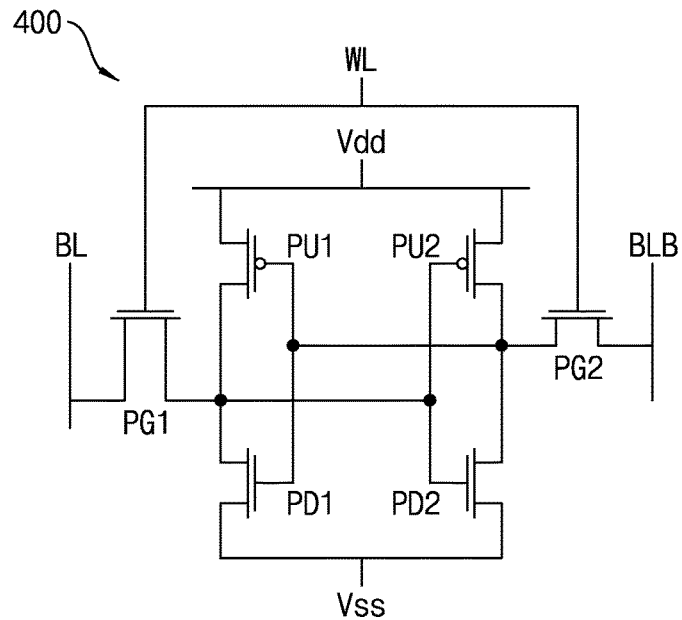
FIG. 4A illustrates a circuit schematic of an SRAM cell.
Figure 4B:
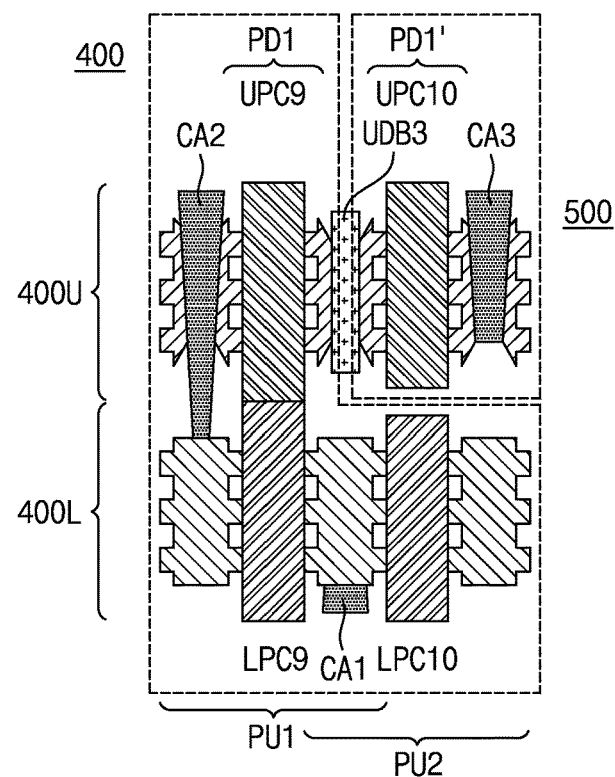
FIG. 4B illustrates a portion of the SRAM cell shown in FIG. 4A and an adjacent SRAM cell in a form of multi-stack semiconductor device, according to an embodiment.

FIG. 4A illustrates a circuit schematic of an SRAM cell, and FIG. 4B illustrates a portion of the SRAM cell shown in FIG. 4A and an adjacent SRAM cell in a form of multi-stack semiconductor device, according to an embodiment.

Referring to FIG. 4A, an SRAM cell 400 includes six metal-oxide semiconductor field effect transistors (MOSFETs) to form a six-transistor (6T)-SRAM cell. The six MOSFETs are pull-up transistors PU1 and PU2, pull-down transistors PD1 and PD2, and pass-gate transistors PG1 and PG2. Each of the pull-up transistors PU1 and PU2 may be formed of a PMOS, and each of the pull-down transistors PD1, PD2 and the pass-gate transistors PG1 and PG2 may be formed of an NMOS. Each bit in the SRAM cell 400 is stored on the four transistors PU1, PD1, PU2 and PD2 that form two cross-coupled inverters. For example, the pull-up transistor PU1 and the pull-down transistor PD1 form one inverter, and the pull-up transistor PU2 and the pull-down transistor PD2 form the other inverter. The two pass-gate transistors PG1 and PG2 serve to control access to a memory cell formed of the two cross-coupled inverters during read and write operations.

The pull-up transistors PU1 and PU2 receive a positive voltage VDD at their merged or connected source/drain, and the pull-down transistors PD1 and PD2 receive a ground voltage VSS at their merged or connected source/drain. The pass-gate transistors PG1 and PG2 are respectively connected to a bit line BL and a complementary bit line BLB at their source/drains, and commonly connected to a word line WL at their gates. In particular, the pull-up transistor PU1 and the pull-down transistor PD1 share their gate to be connected to a source/drain of the pass-gate PG2, and the pull-up transistor PU2 and the pull-down transistor PD2 share their gate to be connected to a source/drain of the pass-gate PG1.

Accordingly, FIG. 4B illustrating a portion of the SRAM cell 400 of FIG. 4A and a portion of an adjacent SRAM cell 500 shows that the pull-up transistors PU1 and PU2, both being a PMOS, are formed on a lower stack 400L to receive a common positive voltage VSS through a source/drain contact structure CA1. FIG. 4B further shows that a lower gate structure LPC9 of the pull-up transistor PU1 is connected to an upper gate structure UPC9 of the pull-down transistor PD1, an NMOS, formed on an upper stack 400U so that the two transistors PU1 and PD1 share a gate as shown in FIG. 4A. In addition, a source/drain region of the pull-up transistor PU1 and a source/drain region of the pull-down transistor PD1 are connected to each other through a source/drain contact structure CA2 extended from the upper stack 400U to the lower stack 400L.

In contrast, a lower gate structure LPC10 of the pull-up transistor PU2 is disconnected from an upper gate structures UPC10 of a pull-down transistor PD1' of the SRAM cell 500 as the pull-up transistor PU2 of the SRAM cell 400 does not share a gate with the pull-down transistor PD1' of the SRAM cell 500. Further, the pull-down transistor PD1 of the SRAM cell 400 is insulated from the pull-down transistor PD1' of the SRAM cell 500 through the upper diffusion break structure UDB3. A source/drain region of the pull-down transistor PD1' of the SRAM cell 500 may be connected to a ground source or another circuit element though a source/drain contact structure CA3 formed thereon.

It is noted from FIG. 4B that the portion of the SRAM cell 400 and the portion of the SRAM cell 500 correspond to a portion of FIG. 3C including the lower nanosheet structures LT9 and LT10, and the upper nanosheet structures UT9 and UT10.

Figure 5A:
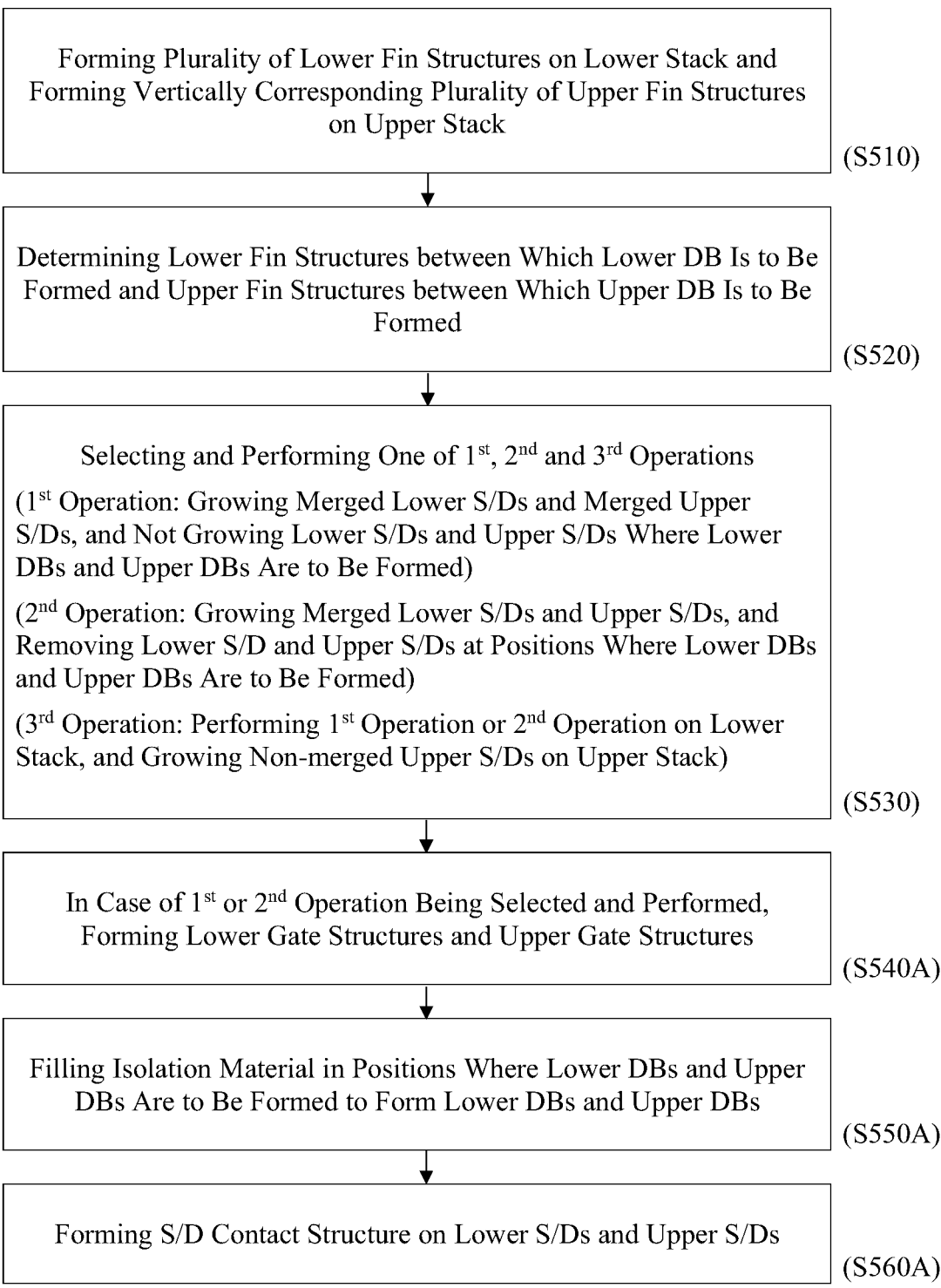
FIGS. 5A and 5B illustrate a method of manufacturing a multi-stack semiconductor device including a plurality of multi-stack nanosheet structures and diffusion break structures formed on a lower stack and an upper stack in reference to FIGS. 2A-2C and 3A-3C, according to an embodiment.
Figure 5B:
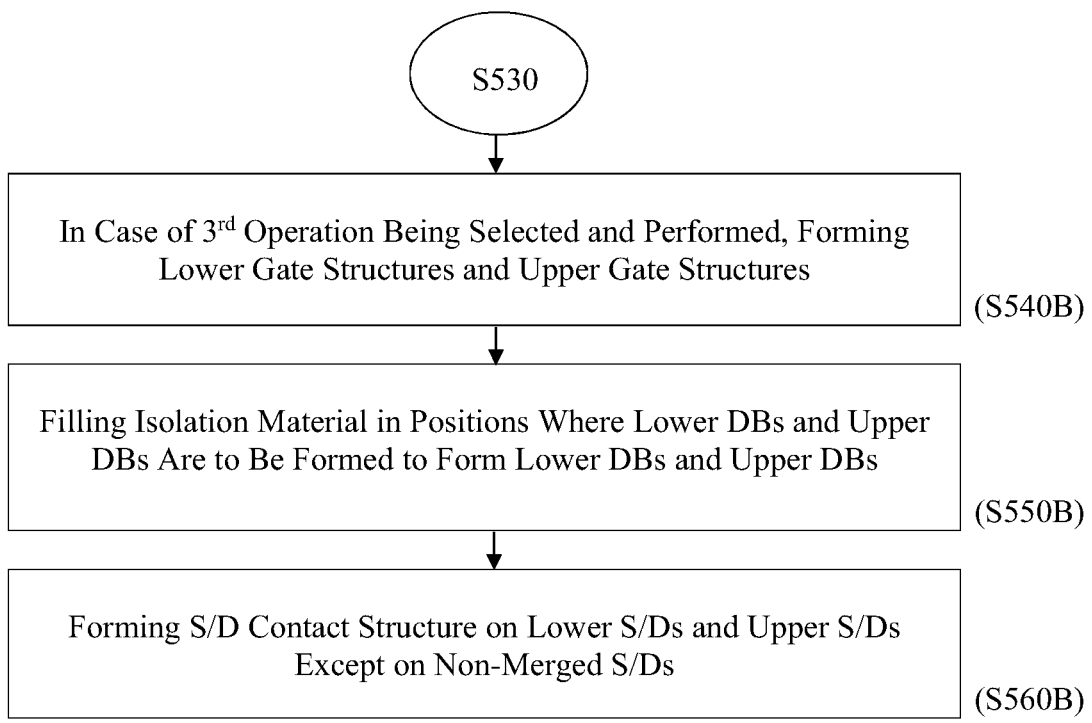

FIGS. 5A and 5B illustrate a method of manufacturing a multi-stack semiconductor device including a plurality of multi-stack nanosheet structures and diffusion break structures formed on a lower stack and an upper stack in reference to FIGS. 2A-2C and 3A-3C, according to an embodiment.

In operation S510, a plurality of lower fin structures are formed in a row on a lower stack and a plurality of upper fin structures are formed in a row on an upper stack such that the upper fin structures vertically correspond to the lower fin structures, respectively.

According to an embodiment, each of the lower fin structures and the upper fin structures may include a plurality of nanosheet layers, in which case a plurality of sacrificial layers corresponding to the nanosheet layers and the nanosheet layers may be layered in an alternating sequence on a substrate to form the lower fin structures and the upper fin structures. The sacrificial layers may be removed and replaced with lower gate structures and upper gate structures in a later operation.

In operation S520, at least one of a pair of lower fin structures between which a lower diffusion break structure is to be formed and a pair of upper fin structures between which an upper diffusion break structure is to be formed is determined from among the lower fin structures and the upper fin structures.

In operation S530, one of a $1^{st}$ operation, a $2^{nd}$ operation and a $3^{rd}$ operation is selected and performed.

The $1^{st}$ operation includes growing lower source/drain regions from each of the lower fin structures and growing upper source/drain regions from each of the upper fin structures such that the lower source/drain regions grown at a position between two adjacent lower fin structures are merged, and the upper source/drain regions grown at a position between two adjacent upper fin structures are merged. However, in this $1^{st}$ operation, no lower source/drain region is grown from two adjacent lower fin structures at a position where a lower diffusion break structure is to be formed, and no upper source/drain region is grown from two adjacent upper fin structures at a position where an upper diffusion break structure is to be formed.

The $2^{nd}$ operation includes growing lower source/drain regions from each of the lower fin structures and growing upper source/drain regions from each of the upper fin structures such that the lower source/drain regions grown at a position between two adjacent lower fin structures are merged, and the upper source/drain regions grown at a position between two adjacent are merged. However, in this $2^{nd}$ operation, the lower source/drain regions grown from two adjacent lower fin structures at a position where a lower diffusion break structure is to be formed are removed. Likewise, the upper source/drain regions grown from adjacent two upper diffusion break structures at a position where an upper diffusion break structure is to be formed are removed.

The $3^{rd}$ operation includes performing the $1^{st}$ operation or the $2^{nd}$ operation on the lower stack, and, on the upper stack, growing upper source/drain regions from each of the upper fin structures such that the upper source/drain regions grown at a position between any two adjacent upper fin structures are not merged.

It is noted that the $1^{st}$ operation and the $2^{nd}$ operation are performed to form the multi-stack semiconductor device 200 shown in FIGS. 2A-2C, and the $3^{rd}$ operation is performed to form the multi-stack semiconductor device 300 shown in FIGS. 3A-3C. Thus, the lower source/drain regions grown on the lower stack and the upper source/drain regions grown on the upper stack through the $1^{st}$ operation and the $2^{nd}$ operation, respectively, are merged source/drain regions, as shown in FIGS. 2A-2C. However, the upper source/drain regions grown on the upper stack through the $3^{rd}$ operation are non-merged source/drain regions, while the lower source/drain regions grown on the lower stack through the $3^{rd}$ operation are merged source/drain regions, as shown in FIGS. 3A-3C.

In this operation S530, growing the lower source/drain regions may be performed on the lower stack prior to growing the upper source/drain regions on the upper stack, according to an embodiment. However, this order may change according to a design of the multi-stack semiconductor device. The lower source/drain regions and the upper source/drain regions may be grown from each of the low fin structures and the upper fin structures, respectively, through an epitaxy process, to a left side and a right side of each of the lower fin structures and the upper fin structures. According to embodiments, each of the lower fin structures and the upper fin structures may include a plurality of nanosheet layers or a finFET fin structure.

Meanwhile, in this operation S530, at least one position where at least one of the lower diffusion break structure and the upper diffusion break structure is to be formed may be left as a void space (i.e., a lower space and/or an upper space) isolating two adjacent lower transistor structures and/or two adjacent upper transistor structures, formed at a left side and a right side of the space, from each other.

Operation 540A is performed when $1^{st}$ operation or $2^{nd}$ operation is selected and performed in operation S530. In this operation S540, a plurality of lower gate structures respectively surrounding the lower fin structures and a plurality of upper gate structures respectively surrounding the upper fin structures are formed. In this operation, the lower gate structures and the upper gate structures may be formed by replacing previously formed dummy gate structures (not shown) and sacrificial layers (not shown), if each of the lower fin structures and the upper fin structures is formed of a plurality of nanosheet layers.

In operation S550A, an isolation material may be filled in at least one of the positions obtained in operation 530 to form at least one of the lower diffusion break structures and the upper diffusion break structures on at least one of the lower stack and the upper stack.

In operation S560A, a source/drain contact structure may be connected to at least one of the lower source/drain regions formed on the lower stack and the upper source/drain regions formed on the upper stack to connect the source/drain region to a positive voltage source, a ground source, or another circuit element.

Operation S540B is performed when $3^{rd}$ operation is selected and performed in operation S530. In this operation S540B, like in operation S540A, a plurality of lower gate structures surrounding the lower fin structures, respectively, and a plurality of upper gate structures surrounding the upper fin structures, respectively, are formed. Here, the lower gate structures and the upper gate structures may be formed by replacing previously formed dummy gate structures (not shown) and sacrificial layers (not shown), if each of the lower fin structures and the upper fin structures is formed of a plurality of nanosheet layers.

In operation S550B, like in operation S550A, an isolation material may be filled in at least one of the positions obtained in operation 530 to form at least one of the lower diffusion break structures and the upper diffusion break structures on at least one of the lower stack and the upper stack. In this operation S550B, on the upper stack, the isolation material may be filled in the space between the non-merged upper source/drain regions.

In operation S560B, a source/drain contact structure may be connected to at least one of the lower source/drain regions formed on the lower stack like in operation 550A. However, on the upper stack, a source/drain contact structure is not connected to the upper source/drain regions formed in the space so that the upper source/drain regions formed therein are disabled. When the upper source/drain regions in the space are disabled, the upper nanosheet structures including these upper source/drain regions may also be disabled.

FIG. 6 illustrates a schematic plan view of a semiconductor module according to an embodiment.

Referring to FIG. 6, a semiconductor module 600 according to an embodiment may include a processor 620 and semiconductor devices 630 that are mounted on a module substrate 610. The processor 620 and/or the semiconductor devices 630 may include one or more multi-stack semiconductor devices described in at least one of the above embodiments.

Figure 7:
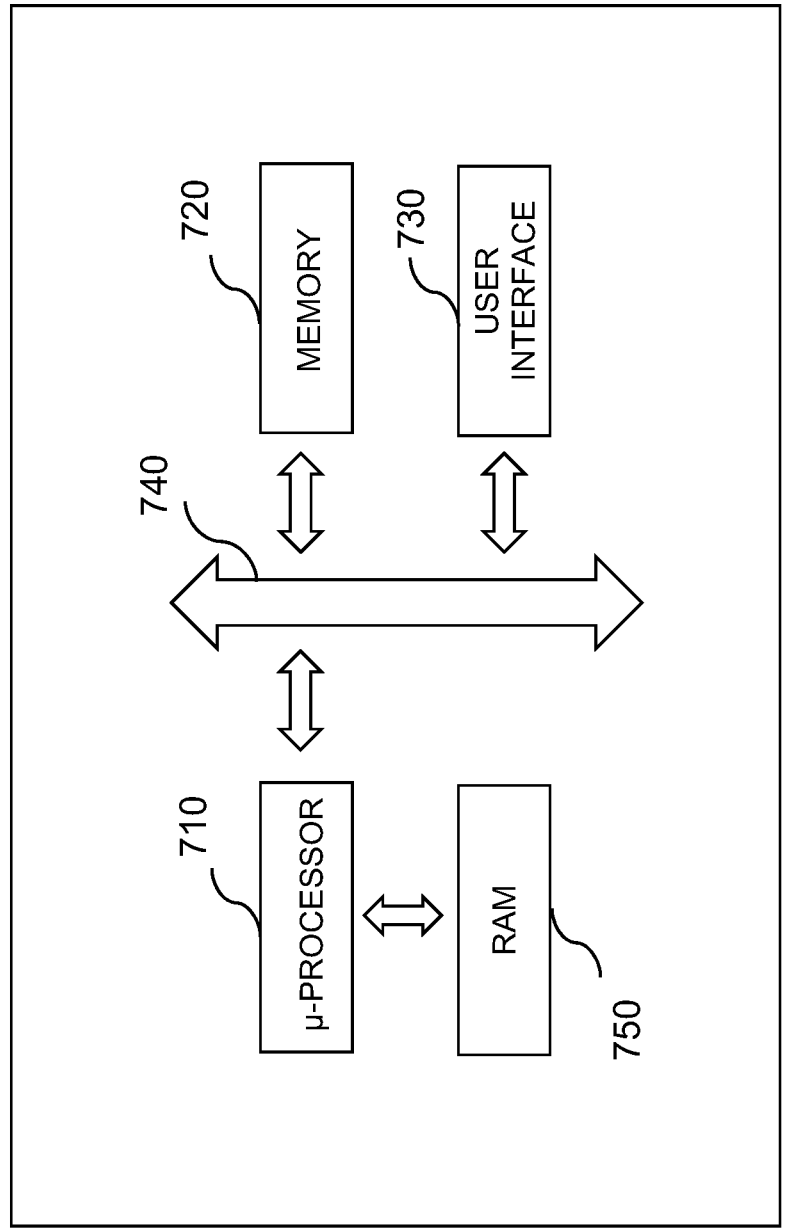
FIG. 7 illustrates a schematic block diagram of an electronic system according to an embodiment.

FIG. 7 illustrates a schematic block diagram of an electronic system according to an embodiment.

Referring to FIG. 7, an electronic system 700 in accordance with an embodiment may include a microprocessor 710, a memory 720, and a user interface 730 that perform data communication using a bus 740. The microprocessor 710 may include a central processing unit (CPU) or an application processor (AP). The electronic system 700 may further include a random access memory (RAM) 750, in direct communication with the microprocessor 710. The microprocessor 710 and/or the RAM 750 may be implemented in a single module or package. The user interface 730 may be used to input data to the electronic system 700, or output data from the electronic system 700. For example, the user interface 730 may include a keyboard, a touch pad, a touch screen, a mouse, a scanner, a voice detector, a liquid crystal display (LCD), a micro light-emitting device (LED), an organic light-emitting diode (OLED) device, an active-matrix light-emitting diode (AMOLED) device, a printer, a lighting, or various other input/output devices without limitation. The memory 720 may store operational codes of the microprocessor 710, data processed by the microprocessor 710, or data received from an external device. The memory 720 may include a memory controller, a hard disk, or a solid state drive (SSD).

At least one of the microprocessor 710, the memory 720 and/or the RAM 750 in the electronic system 700 may include one or more of the multi-stack semiconductor devices described in at least one the above embodiments.

The foregoing is illustrative of example embodiments and is not to be construed as limiting thereof. Although a number of example embodiments have been described, those skilled in the art will readily appreciate that many modifications are possible in the above embodiments without materially departing from the inventive concept.

What is claimed is:

1. A multi-stack semiconductor device comprising:
a plurality of lower transistor structures arranged in a row on a lower stack on a top surface of a substrate and comprising a plurality of lower fin structures extended in a $1^{st}$ direction and surrounded by a plurality of lower gate structures extended in a $2^{nd}$ direction, respectively, the $1^{st}$ and $2^{nd}$ directions being perpendicular to each other and in parallel with the top surface of the substrate;
a plurality of upper transistor structures arranged in a row on an upper stack above the plurality of lower transistor structures in a 3$^{rd}$ direction perpendicular to the 1$^{st}$ and 2$^{nd}$ directions, respectively, and comprising a plurality of upper fin structures surrounded by a plurality of upper gate structures, respectively; and at least one of a 1$^{st}$ lower diffusion break structure on the lower stack and a 1$^{st}$ upper diffusion break structure on the upper stack, the 1$^{st}$ upper diffusion break structure being formed above a lower source/drain region of on the lower stack, and the 1$^{st}$ lower diffusion break structure being formed below an upper source/drain region on the upper stack, in the 3$^{rd}$ direction, wherein the 1$^{st}$ lower diffusion break structure is formed between 1$^{st}$ two adjacent lower gate structures, and isolates 1$^{st}$ two lower transistor structures respectively comprising the 1$^{st}$ two adjacent lower gate structures from each other, and wherein the 1$^{st}$ upper diffusion break structure is formed between 1$^{st}$ two adjacent upper gate structures, and isolates 1$^{st}$ two upper transistor structures respectively comprising the 1$^{st}$ two adjacent upper gate structures from each other.

2. The multi-stack semiconductor device of claim 1,
wherein the multi-stack semiconductor device comprises only the 1$^{st}$ lower diffusion break structure among the 1$^{st}$ lower diffusion break structure and the 1$^{st}$ upper diffusion break structure, and
wherein, on the upper stack above the 1$^{st}$ lower diffusion break structure in the 3$^{rd}$ direction, an upper source/drain region is formed to be shared by 2$^{nd}$ two upper transistor structures respectively comprising 2$^{nd}$ two adjacent upper gate structures, corresponding to the 1$^{st}$ two adjacent lower gate structures.

3. The multi-stack semiconductor device of claim 2,
wherein the multi-stack semiconductor device further comprises a 2$^{nd}$ lower diffusion break structure on the lower stack, and a 2$^{nd}$ upper diffusion break structure, on the upper stack, above the 2$^{nd}$ lower diffusion break structure in the 3$^{rd}$ direction,
wherein the 2$^{nd}$ lower diffusion break structure is formed between 2$^{nd}$ two adjacent lower gate structures, and isolates 2$^{nd}$ two lower transistor structures respectively comprising the 2$^{nd}$ two adjacent lower gate structures from each other, and
wherein the 2$^{nd}$ upper diffusion break structure is formed between 3$^{rd}$ two adjacent upper gate structures, and isolates 3$^{rd}$ two upper transistor structures respectively comprising the 3$^{rd}$ two adjacent upper gate structures from each other.

4. The multi-stack semiconductor device of claim 2,
wherein the multi-stack semiconductor device comprises both the lower diffusion break structure and the upper diffusion break structure, and
wherein, on the lower stack below the 1$^{st}$ upper diffusion break structure in the 3$^{rd}$ direction, a lower source/drain region is formed to be shared by 2$^{nd}$ two lower transistor structures respectively comprising 2$^{nd}$ two adjacent lower gate structures, corresponding to the 1$^{st}$ two adjacent upper gate structures.

5. The multi-stack semiconductor device of claim 4,
wherein the multi-stack semiconductor device further comprises a 2$^{nd}$ lower diffusion break structure on the lower stack, and a 2$^{nd}$ upper diffusion break structure, on the upper stack, above the 2$^{nd}$ lower diffusion break structure in the 3$^{rd}$ direction,
wherein the 2$^{nd}$ lower diffusion break structure is formed between 3$^{rd}$ two adjacent lower gate structures, and isolates 3$^{rd}$ two lower transistor structures respectively comprising the 3$^{rd}$ two adjacent lower gate structures from each other, and
wherein the 2$^{nd}$ upper diffusion break structure is formed between 3$^{rd}$ two adjacent upper gate structures, and isolates 3$^{rd}$ two upper transistor structures respectively comprising the 3$^{rd}$ two adjacent upper gate structures from each other.

6. The multi-stack semiconductor device of claim 1,
wherein the multi-stack semiconductor device comprises only the 1$^{st}$ upper diffusion break structure among the 1$^{st}$ lower diffusion break structure and the 1$^{st}$ upper diffusion break structure, and
wherein, on the lower stack below the 1$^{st}$ upper diffusion break structure in the 3$^{rd}$ direction, a lower source/drain region is formed to be shared by 2$^{nd}$ two lower transistor structures respectively comprising 2$^{nd}$ two adjacent lower gate structures, corresponding to the 1$^{st}$ two adjacent upper gate structures.

7. The multi-stack semiconductor device of claim 6,
wherein the multi-stack semiconductor device further comprises a 2$^{nd}$ lower diffusion break structure on the lower stack, and a 2$^{nd}$ upper diffusion break structure, on the upper stack, above the 2$^{nd}$ lower diffusion break structure in the 3$^{rd}$ direction,
wherein the 2$^{nd}$ lower diffusion break structure is formed between 3$^{rd}$ two adjacent lower gate structures, and isolates 3$^{rd}$ two lower transistor structures respectively comprising the 3$^{rd}$ two adjacent lower gate structures from each other, and
wherein the 2$^{nd}$ upper diffusion break structure is formed between 2$^{nd}$ two adjacent upper gate structures, and isolates 2$^{nd}$ two upper transistor structures respectively comprising the 2$^{nd}$ two adjacent upper gate structures from each other.

8. The multi-stack semiconductor device of claim 1,
wherein the multi-stack semiconductor device comprises both the 1$^{st}$ lower diffusion break structure and the 1$^{st}$ upper diffusion break structure, and
wherein the 1$^{st}$ upper diffusion break structure is formed vertically above the 1$^{st}$ lower diffusion break structure in the 3$^{rd}$ direction.

9. The multi-stack semiconductor device of claim 8, wherein upper source/drain regions of the 1$^{st}$ two upper transistor structures are formed between the 1$^{st}$ two adjacent upper gate structures, and isolated from each other by the 1$^{st}$ upper diffusion break structure.

10. The multi-stack semiconductor device of claim 1,
wherein the multi-stack semiconductor device comprises only the 1$^{st}$ lower diffusion break structure among the 1$^{st}$ lower diffusion break structure and the 1$^{st}$ upper diffusion break structure, and
wherein, on the upper stack above the 1$^{st}$ lower diffusion break structure in the 3$^{rd}$ direction, upper source/drain regions of 2$^{nd}$ two upper transistor structures respectively comprising 2$^{nd}$ two adjacent upper gate structures, corresponding to the 1$^{st}$ two adjacent lower gate structures, are formed between the 2$^{nd}$ two adjacent upper gate structures, and share a source/drain region contact structure.

11. The multi-stack semiconductor device of claim 10,
wherein the multi-stack semiconductor device further comprises a 2$^{nd}$ lower diffusion break structure on the lower stack, and a 2$^{nd}$ upper diffusion break structure, on the upper stack, above the 2$^{nd}$ lower diffusion break structure in the 3$^{rd}$ direction, wherein the $2^{nd}$ lower diffusion break structure is formed between $2^{nd}$ two adjacent lower gate structures, and isolates $2^{nd}$ two lower transistor structures respectively comprising the $2^{nd}$ two adjacent lower gate structures from each other, and wherein the $2^{nd}$ upper diffusion break structure is formed between $3^{rd}$ two adjacent upper gate structures, and isolates $3^{rd}$ two upper transistor structures respectively comprising the $3^{rd}$ two adjacent upper gate structures from each other.

12. The multi-stack semiconductor device of claim 10, wherein the multi-stack semiconductor device comprises both the lower diffusion break structure and the upper diffusion break structure, and wherein, on the lower stack below the $1^{st}$ upper diffusion break structure in the $3^{rd}$ direction, a lower source/drain region is formed to be shared by $2^{nd}$ two lower transistor structures respectively comprising $2^{nd}$ two adjacent lower gate structures, corresponding to the $1^{st}$ two adjacent upper gate structures.

13. The multi-stack semiconductor device of claim 12, wherein the multi-stack semiconductor device further comprises a $2^{nd}$ lower diffusion break structure on the lower stack, and a $2^{nd}$ upper diffusion break structure, on the upper stack, above the $2^{nd}$ lower diffusion break structure in the $3^{rd}$ direction, wherein the $2^{nd}$ lower diffusion break structure is formed between $3^{rd}$ two adjacent lower gate structures, and isolates $3^{rd}$ two lower transistor structures respectively comprising the $3^{rd}$ two adjacent lower gate structures from each other, and wherein the $2^{nd}$ upper diffusion break structure is formed between $3^{rd}$ two adjacent upper gate structures, and isolates $3^{rd}$ two upper transistor structures respectively comprising the $3^{rd}$ two adjacent upper gate structures from each other.

14. The multi-stack semiconductor device of claim 1, wherein the multi-stack semiconductor device comprises only the $1^{st}$ upper diffusion break structure among the $1^{st}$ lower diffusion break structure and the $1^{st}$ upper diffusion break structure, and wherein upper source/drain regions of the $1^{st}$ two upper transistor structures are formed between the $1^{st}$ two adjacent upper gate structures, and isolated from each other by the $1^{st}$ upper diffusion break structure.

15. The multi-stack semiconductor device of claim 14, wherein, on the lower stack below the $1^{st}$ upper diffusion break structure in the $3^{rd}$ direction, a lower source/drain region is formed to be shared by $2^{nd}$ two lower transistor structures respectively comprising $2^{nd}$ two adjacent lower gate structures, corresponding to the $1^{st}$ two adjacent upper gate structures.

16. The multi-stack semiconductor device of claim 15, wherein the multi-stack semiconductor device further comprises a $2^{nd}$ lower diffusion break structure on the lower stack, and a $2^{nd}$ upper diffusion break structure, on the upper stack, above the $2^{nd}$ lower diffusion break structure in the $3^{rd}$ direction, wherein the $2^{nd}$ lower diffusion break structure is formed between $3^{rd}$ two adjacent lower gate structures, and isolates $3^{rd}$ two lower transistor structures respectively comprising the $3^{rd}$ two adjacent lower gate structures from each other, and wherein the $2^{nd}$ upper diffusion break structure is formed between $2^{nd}$ two adjacent upper gate structures, and isolates $2^{nd}$ two upper transistor structures respectively comprising the $2^{nd}$ two adjacent upper gate structures from each other.

17. The multi-stack semiconductor device of claim 1, wherein each of the lower fin structures and the upper fin structures comprises a plurality of nanosheet layers.

18. A multi-stack semiconductor device comprising:

a plurality of lower transistor structures arranged in a row on a lower stack on a top surface of a substrate and comprising a plurality of lower fin structures extended in a $1^{st}$ direction and surrounded by a plurality of lower gate structures extended in a $2^{nd}$ direction, respectively, the $1^{st}$ and $2^{nd}$ directions being perpendicular to each other and in parallel with the top surface of the substrate;

a plurality of upper transistor structures arranged in a row on an upper stack to above the plurality of lower transistor structures in a $3^{rd}$ direction perpendicular to the $1^{st}$ and $2^{nd}$ directions, respectively, and comprising a plurality of upper fin structures surrounded by a plurality of upper gate structures, respectively, wherein a lower void space is formed on the lower stack, an upper void space is formed on the upper stack, or both the lower void space and the upper void space are formed on the lower stack and the upper stack, respectively, wherein the lower void space is formed, as a lower diffusion break structure, between two adjacent lower gate structures, and isolates two lower transistor structures respectively comprising the two adjacent lower gate structures from each other on the lower stack, and wherein the upper void space is formed, as an upper diffusion break structure, between two adjacent upper gate structures, and isolates two upper transistor structures respectively comprising the two adjacent upper gate structures from each other on the upper stack.

19. The multi-stack semiconductor device of claim 18, wherein the lower void space is formed at a position where a lower source/drain region of each of the two lower transistor structures is to be formed, or was formed and removed, between the two adjacent lower gate structures, and wherein the upper void space is formed at a position where an upper source/drain region of each of the two upper transistor structures is to be formed, or was formed and removed, between the two adjacent upper gate structures.

* * * * *